United States Patent
Daga et al.

(10) Patent No.: US 8,621,290 B2
(45) Date of Patent: Dec. 31, 2013

(54) MEMORY SYSTEM THAT SUPPORTS PROBALISTIC COMPONENT-FAILURE CORRECTION WITH PARTIAL-COMPONENT SPARING

(75) Inventors: Bharat K. Daga, Fremont, CA (US); Robert E. Cypher, Saratoga, CA (US)

(73) Assignee: Oracle International Corporation, Redwood Shores, CA (US)

(*) Notice: Subject to any disclaimer, the term of this patent is extended or adjusted under 35 U.S.C. 154(b) by 706 days.

(21) Appl. No.: 12/782,580

(22) Filed: May 18, 2010

(65) Prior Publication Data

US 2011/0289368 A1 Nov. 24, 2011

(51) Int. Cl.
*G06F 11/00* (2006.01)
*G11C 29/00* (2006.01)
*H03M 13/00* (2006.01)

(52) U.S. Cl.
USPC ........... 714/710; 714/701; 714/723; 714/767; 714/781

(58) Field of Classification Search
None
See application file for complete search history.

(56) References Cited

U.S. PATENT DOCUMENTS

| | | | | |
|---|---|---|---|---|
| 5,357,527 A | * | 10/1994 | Coates et al. | 714/755 |
| 5,450,423 A | * | 9/1995 | Iwasaki et al. | 714/767 |
| 5,535,227 A | * | 7/1996 | Silvano | 714/766 |
| 5,550,849 A | * | 8/1996 | Harrington | 714/752 |
| 5,563,894 A | * | 10/1996 | Fujiwara et al. | 714/785 |
| 5,623,506 A | * | 4/1997 | Dell et al. | 714/766 |
| 5,666,371 A | * | 9/1997 | Purdham | 714/763 |
| 6,003,144 A | * | 12/1999 | Olarig et al. | 714/42 |
| 6,024,486 A | * | 2/2000 | Olarig et al. | 714/763 |
| 6,336,203 B1 | * | 1/2002 | Yoshida | 714/785 |
| 7,676,729 B2 | * | 3/2010 | Cheng et al. | 714/767 |

* cited by examiner

*Primary Examiner* — Daniel McMahon
(74) *Attorney, Agent, or Firm* — Park, Vaughan, Fleming & Dowler, LLP

(57) ABSTRACT

A memory system that facilitates probabilistic error correction for a failed memory component with partial-component sparing. The memory system accesses blocks of data, each block including an array of bits logically organized into R rows and C columns. The C columns include (1) a row-checkbit column containing row-parity bits for each of the R rows, (2) an inner-checkbit column containing $X=R-S$ inner checkbits and S spare bits, and (3) C-2 data-bit columns containing data bits. Each column is stored in a different memory component. When the memory system determines that a memory component has failed, the memory system examines the pattern of errors associated with the failed component to determine if the failure affects a partial component associated with S or fewer bits. If so, the memory system corrects and remaps data bits from the failed partial component to the S spare data bits in the inner-checkbit column.

20 Claims, 6 Drawing Sheets

US 8,621,290 B2

MEMORY SYSTEM THAT SUPPORTS PROBALISTIC COMPONENT-FAILURE CORRECTION WITH PARTIAL-COMPONENT SPARING

RELATED APPLICATION

The subject matter of this application is related to the subject matter in a pending non-provisional application by inventor Robert E. Cypher entitled, "Facilitating Probabilistic Error Detection and Correction after a Memory Component Failure," having Ser. No. 12/494,514, and filing date 30 Jun. 2009. This related application is hereby incorporated by reference.

BACKGROUND

1. Field

The present invention generally relates to error-detection and error-correction mechanisms in computer memories. More specifically, the present invention relates to a computer system memory that supports probabilistic component-failure correction with partial-component sparing.

2. Related Art

Computer systems routinely employ error-detecting and error-correcting codes to detect and/or correct various data errors which are caused, for example, by noisy communication channels and unreliable storage media. Some error-detecting and error-correcting codes, such as single error correction, double error detection (SECDED) Hamming codes, can be used to correct single-bit errors and detect double-bit errors. Other codes, which are based on Galois fields, can be used to correct a special class of multi-bit errors caused by a failure of an entire memory component. (For example, see U.S. Pat. No. 7,188,296, entitled "ECC for Component Failures Using Galois Fields," by inventor Robert E. Cypher, filed 30 Oct. 2003, referred to as "the '296 patent.")

After a memory component fails, it is desirable to be able to detect and correct additional errors that arise during subsequent computer system operation. The technique described in the '296 patent can correct for subsequent single-bit errors. However, the technique described in the '296 patent cannot correct for subsequent errors which arise from an additional memory component failure.

Hence, what is needed is a method and an apparatus that can correct for errors caused by an additional memory component failure.

SUMMARY

The disclosed embodiments relate to a memory system that facilitates probabilistic error correction for a failed memory component with partial-component sparing. During operation, the memory system accesses blocks of data, wherein each block of data includes an array of bits logically organized into R rows and C columns. The C columns include (1) a row-checkbit column containing row-parity bits for each of the R rows, (2) an inner-checkbit column containing X=R−S inner checkbits and S spare bits, and (3) C-2 data-bit columns containing data bits. In addition, each column is stored in a different memory component, and the checkbits are generated from the data bits to provide guaranteed detection and probabilistic correction for a failed memory component. When the memory system determines that a memory component has failed, the memory system examines the pattern of errors associated with the failed component to determine if the failure affects a partial component, which is associated with S or fewer bits of an associated failed column in each block of data. If so, the memory system corrects and remaps data bits from the failed partial component to the S spare data bits in the inner-checkbit column. Next, after the correcting and remapping operations are complete, the memory system resumes operation with guaranteed detection and probabilistic correction of a subsequent failed memory component.

In some embodiments, the memory system determines that a component has failed while accessing a block of data. During this access, the memory system regenerates the checkbits for the two checkbit columns from the data bits in the data-bit columns. The memory system then compares the regenerated checkbits with the existing checkbits in the two checkbit columns, and determines whether the memory component has failed based on the comparison.

In some embodiments, while comparing the regenerated checkbits with the existing checkbits, the memory system computes a row syndrome by exclusive-ORing the regenerated row-parity bits with the existing row-parity bits. The memory system also computes an inner syndrome by exclusive-ORing the regenerated inner checkbits with the existing inner checkbits. Finally, if the row syndrome viewed as an element of $GF(2^X)$ is non-zero, the memory system uses the row syndrome and the inner syndrome to determine a key for a column associated with the failed memory component, and then compares the determined key against the set of keys to identify the failed memory component.

In some embodiments, for a given block of data, correcting the data bits from the failed partial component involves: correcting a partial column associated with the failed partial component in the given block to produce a corrected partial column; and then regenerating the row-parity bits and the inner checkbits for the given block including the corrected partial column.

In some embodiments, correcting the partial column associated with the failed partial component involves using the row syndrome to identify erroneous bits in the partial column associated with the failed partial component, and then flipping the identified erroneous bits to produce the corrected partial column.

In some embodiments, if the pattern of errors associated with the failed component indicates that the failure affects more than a partial component, the correcting and remapping operations do not take place. Instead, while performing a subsequent memory access to a block of data, the memory system corrects a column associated with the failed component in the block of data by using the checkbits and the data bits to produce a corrected column. The memory system then regenerates the row-parity bits and the inner checkbits for the block of data including the corrected column. Next, the memory system compares the regenerated row-parity bits and inner checkbits with existing row-parity bits and inner checkbits. If this comparison indicates that there remains a double-bit error wherein both erroneous bits are in the same row and one is in the column associated with the failed component, the memory system flips the erroneous bits to correct the double-bit error.

In some embodiments, the row-parity bit column contains a row-parity bit for each of the R rows in the block. Moreover, the inner-checkbit column contains X<R inner checkbits (wherein X=R−S) which are defined to cover bits in the array in accordance with a set of check vectors. Each of these check vectors is associated with a different bit in the array and is an element of a Galois field ($GF(2^X)$), wherein the check vectors are derived from a set of keys which are unique elements of $GF(2^X)$, wherein each key is associated with a different column of the array, and wherein the check vector for a row r of a column c is the product in $GF(2^X)$ of the key for the column c and $\alpha^r$, wherein $\alpha$ is a primitive element of $GF(2^X)$.

In some embodiments, the set of keys are elements of a subfield of $GF(2^X)$, wherein the subfield does not contain any $\alpha^i$, where $1 \leq i < R$.

In some embodiments, $CV(x, y)$ is the check vector associated with the bit at row x and column y of the array, wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

In some embodiments, a key associated with a column $c_y$ is denoted as key $(c_y)$, wherein the set of keys are selected so that for any row r, and for any three distinct columns $c_1$, $c_2$ and $c_3$, key$(c_1)$ XOR key$(c_2)$ is not equal to the product in $GF(2^X)$ of key$(c_1)$ XOR key$(c_3)$ and $\alpha^r$.

In some embodiments, the failed partial component includes a subset of S contiguous bits of a column associated with the failed component, in which case an identifier for the subset is used to indicate which bits have failed.

In some embodiments, the failed partial component includes a subset of S non-contiguous bits of the column associated with the failed component, in which case a bit map is used to indicate which bits have failed.

DETAILED DESCRIPTION

Figure 1:
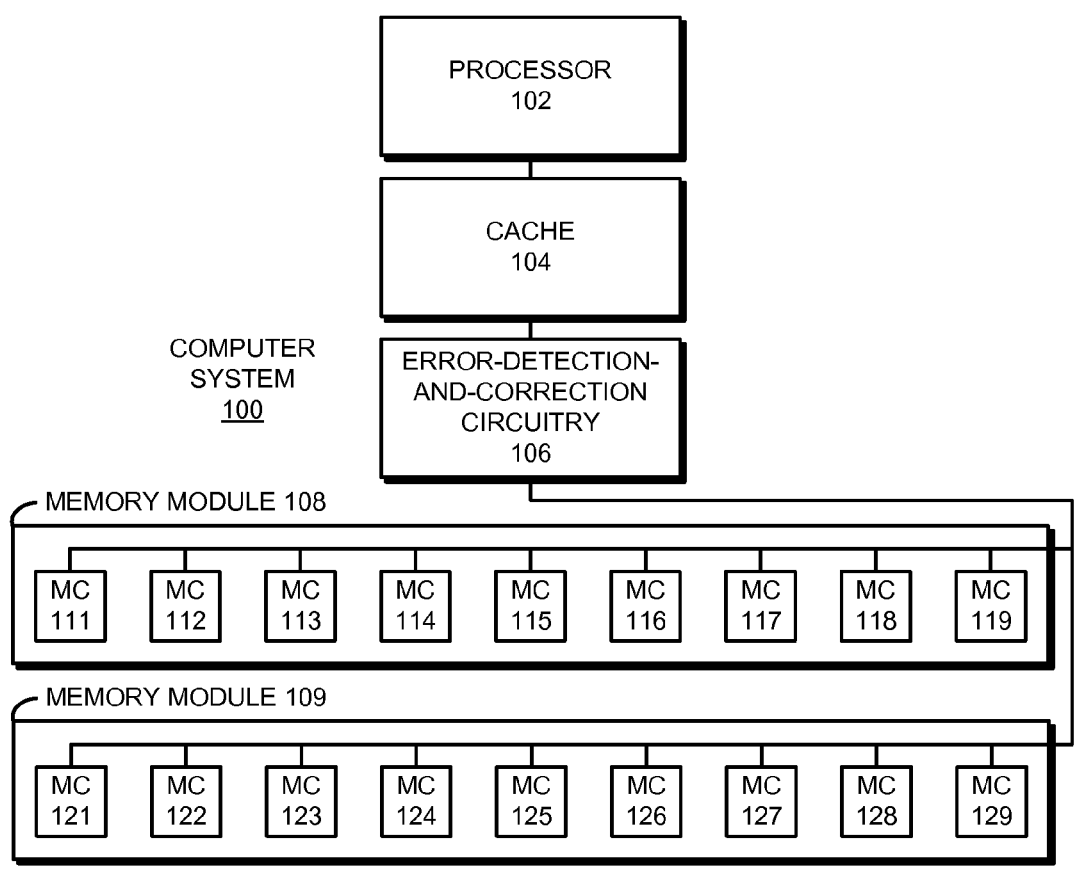
FIG. 1 illustrates a computer system in accordance with an embodiment of the present invention.

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The described embodiments provide error detection and error correction for single-bit and double-bit errors and also for partial and total component failures. More specifically, prior to an identified component failure, the described embodiments provide single-error correction (SEC) and double-error detection (DED), guaranteed component failure detection, and probabilistic component failure correction. Once the identified component has failed, the described embodiments provide guaranteed correction of all errors in the identified failed component, plus guaranteed correction for any additional single-bit errors in other components.

Furthermore, if it has been determined that the failure in the identified component affects only a portion of that component (called a "partial component") with S bits per codeword coming from that partial component (where S is a pre-determined number), the described embodiments support remapping the data to "spare out" that identified failed partial component. Once the identified partial component has been spared out, the described embodiments provide the original error-correcting code (ECC) properties listed above (namely, SECDED, guaranteed component detection, and probabilistic component correction).

For example, a component could be a dynamic random-access memory (DRAM) chip, and a partial component could be a pin on a DRAM chip. In this example, the described embodiments use a code which facilitates probabilistic chip-kill correction along with the ability to spare DRAM pins to significantly reduce the additional service rate caused by DRAM pin failures. This technique can provide guaranteed chip-failure detection and probabilistic chip-failure correction (with probability approximately $1-2^{-24}$) for x4 DRAMs using a burst length of 8. Moreover, this technique can facilitate sparing out any given DRAM pin.

Before describing these error-correction and error-detection techniques, we first describe a computer system which uses these techniques.

Computer System

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109.

Processor 102 can include any type of computational engine that executes code and manipulates data. Cache memory 104 can include one or more caches or levels of caches, which store blocks of data (cache lines) which have recently been accessed or are likely to be accessed in the near future.

Error-detection-and-correction circuitry 106 includes circuitry that performs error-correction and error-detection operations for blocks of data which are retrieved from memory modules 108-109 and which are stored in cache memory 104. Note that the error-correction and error-detection operations can additionally (or alternatively) be performed when blocks of data in cache memory 104 are accessed by processor 102 from cache memory 104. One embodiment of error-detection-and-correction circuitry 106 is described in U.S. Pat. No. 7,188,296, entitled "ECC for Component Failures Using Galois Fields," by inventor Robert E. Cypher, filed 30 Oct. 2003, which is hereby incorporated by reference to provide details about how to implement such circuitry.

Memory modules 108 and 109 include memory components, which can be semiconductor chips containing random-access memory. More specifically, memory module 108 includes memory components (MCs) 111-119 and memory module 109 includes MCs 121-129.

Block Structure

Figure 2:
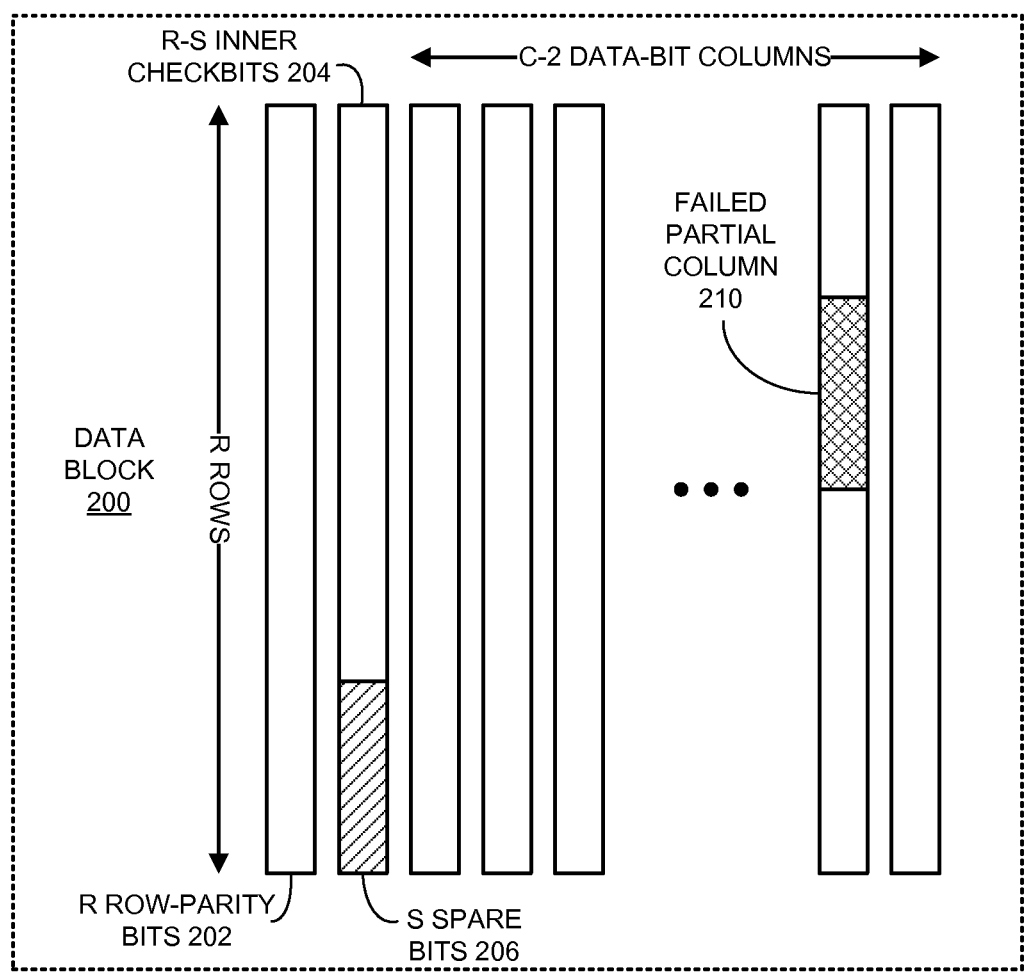
FIG. 2 illustrates a data block in accordance with an embodiment of the present invention.

FIG. 2 illustrates the structure of a data block 200 in an exemplary memory system, which contains a codeword for a code that facilitates error correction and error detection in accordance with an embodiment of the present invention. As mentioned above, data block 200 includes an array of bits logically organized into R rows and C columns. The C columns include (1) a row-checkbit column containing row-parity bits 202 for each of the R rows, (2) an inner-checkbit column containing R-S inner checkbits 204 and S spare bits 206, and (3) C-2 data-bit columns containing data bits. A specific embodiment of the present invention uses the parameters R=32, N=18, X=R−S=24, and S=8. Moreover, each column is stored in a different memory component, and the checkbits are generated from the data bits to provide block-level detection and correction for a failed memory component. The row-checkbit column contains a row-parity bit for each of the R rows in the block. In contrast, the inner-checkbit column contains inner checkbits which are defined to cover bits in the array in accordance with a set of check vectors, wherein each check vector is associated with a different bit in the array and is an element of a Galois field $GF(2^X)$, wherein X=R−S. These check vectors are derived from a set of keys which are unique elements of $GF(2^X)$, wherein each key is associated with a different column of the array. The check vector for a row r of a column c is the product in $GF(2^X)$ of the key for the column c and $\alpha^r$, wherein $\alpha$ is a primitive element of $GF(2^X)$. Techniques for using these checkbits to provide component failure detection and correction are described in related U.S. patent application Ser. No. 12/494,514, which is referenced above.

The disclosed embodiments additionally provide partial-component sparing in which S or fewer bits in a failed partial column 210 (which, for example, can be associated with a specific pin on a memory chip) are corrected and remapped to S spare bits in the inner-checkbit column. This partial-component sparing is described in more detail below.

Partial-Component Sparing

Figure 3:
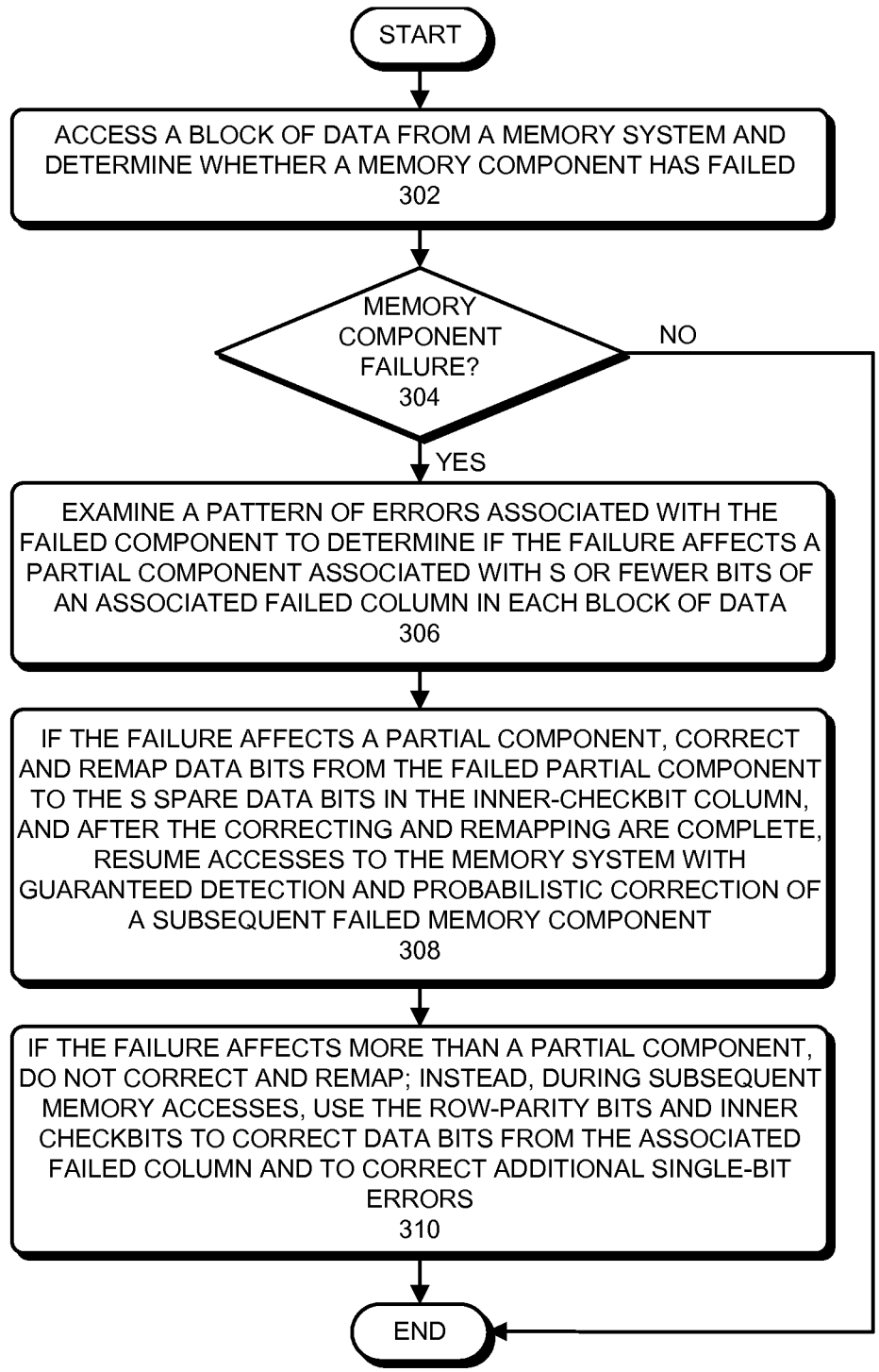
FIG. 3 presents a flow chart illustrating the process of dealing with a failure of a memory component during a memory access in accordance with an embodiment of the present invention.

FIG. 3 presents a flow chart illustrating the process of dealing with a failure of a memory component during a memory access in accordance with an embodiment of the present invention. First, the memory system accesses a block of data and uses the checkbits to determine whether a memory component has failed (step 302). This process is described in more detail below with reference to FIG. 4. If no memory component has failed, and if there are no other errors, the process is complete.

Otherwise, if the memory system determines that a memory component has failed (step 304), the memory system examines the pattern of errors associated with the failed component (through hardware and/or software) to determine if the failure affects a partial component associated with S or fewer bits of an associated failed column in each block of data (step 306). This process is described in more detail below with reference to FIG. 5.

If the failure affects only a partial component, the memory system corrects and remaps data bits from the failed partial component to the S spare data bits in the inner-checkbit column. Note that this remapping operation can be done one cache line (or codeword) at a time while the memory system is in use.

Referring to FIG. 2, in one embodiment, the inner-checkbit column can be used to store the data bits from the failed column, and the failed column can be used to store the R-S inner checkbits 204, with the S spare bits 206 mapping to the failed partial column 210. In an alternative embodiment, the failed partial column 210 can simply be mapped to the S spare bits 206 in the inner-checkbit column.

To facilitate this mapping, the ID of the failed column can be stored in hardware. Moreover, if the failed component is partitioned into partial components, and only one partial component has failed, then the ID of the failed partial component can also be stored in hardware. Alternatively, if an arbitrary set of S bits from the failed component can form the failed partial component, then an identifier for the failed partial component can be stored as a bit mask comprising R bits, with S of them set to 1 (indicating the failed partial component) and the rest set to 0. Next, after the correcting and remapping operations are complete, the memory system resumes operation with guaranteed detection and probabilistic correction of a subsequent failed memory component (step 308).

On the other hand, if the failure affects more than a partial component, the correcting and remapping operations do not take place. Instead, while performing subsequent memory accesses to a block of data, the memory system uses the inner checkbits and row-parity bits to correct data bits from the associated failed column and to correct additional single-bit errors (step 310). This process is described in more detail below with reference to FIG. 6.

Detecting a Memory Component Failure

Figure 4:
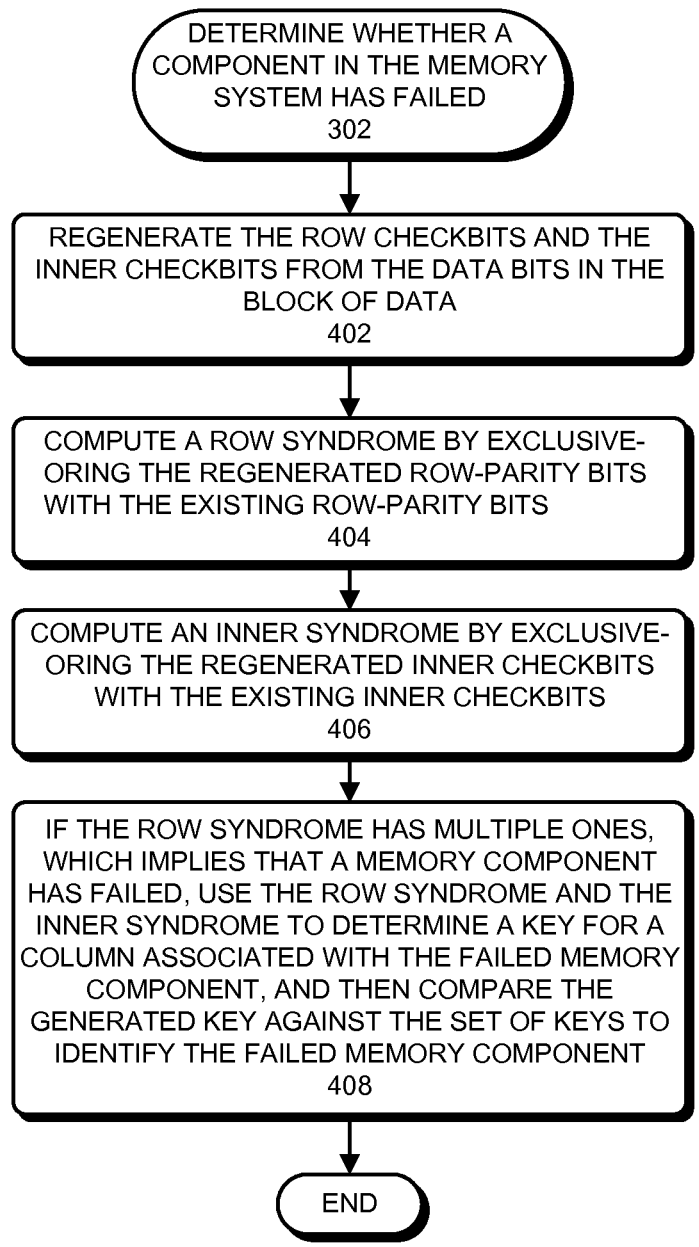
FIG. 4 presents a flow chart illustrating how a failure of a memory component is detected in accordance with an embodiment of the present invention.

FIG. 4 presents a flow chart illustrating in more detail how a failure of a memory component is detected (in step 302 of FIG. 3) in accordance with an embodiment of the present invention. In this embodiment, the system determines that the memory component has failed by first regenerating row-parity bits and inner checkbits from the data bits in the block of data (step 402). Next, the system computes a row syndrome by exclusive-ORing the regenerated row-parity bits with the existing row-parity bits (step 404). The system also computes an inner syndrome by exclusive-ORing the regenerated inner checkbits with the existing inner checkbits (step 406). Next, if the row syndrome has multiple ones, which implies that a memory component has failed, the system uses the row syndrome and the inner syndrome to determine a key for a column associated with the failed memory component, and then compares the generated key against the set of keys to identify the failed memory component (step 408).

Correcting and Remapping Data from a Failed Component

Figure 5:
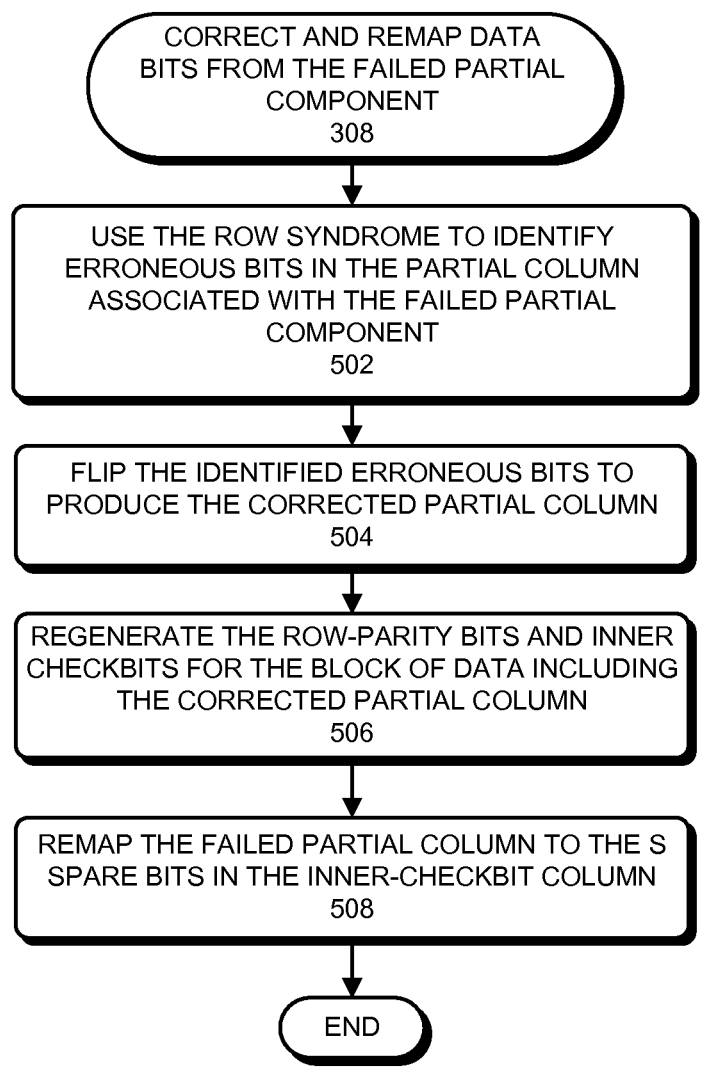
FIG. 5 presents a flow chart illustrating how data from a failed partial component is corrected and remapped in accordance with an embodiment of the present invention.

FIG. 5 presents a flow chart illustrating in more detail how data from a failed partial component is corrected and remapped (in step 308 of FIG. 3) in accordance with an embodiment of the present invention. First, the system uses the row syndrome (which was generated while determining which component had failed) to identify erroneous bits in the partial column associated with the failed partial component (step 502). The system then flips the identified erroneous bits to produce the corrected partial column (step 504). Next, the system regenerates the row-parity bits and inner checkbits from the block of data including the corrected partial column (step 506).

Finally, the system remaps the failed partial column to the S spare bits in the inner-checkbit column (step 508). Referring to FIGS. 1 and 2, this remapping process involves first storing the corrected partial column into the S spare bits 206 in the inner-checkbit column, and then configuring the error-detection-and-correction circuitry 106 so that bits that would normally have been retrieved from the failed partial column 210 are instead retrieved from the S spare bits 206. Alternatively, data bits from the failed column can be stored in the inner-checkbit column and the unfailed portion of the column containing the failed partial column 210 can be used to store the R-S inner checkbits 204, with the S spare bits 206 mapping to the failed partial column 210.

In one embodiment, the remapping process takes place in the background while the memory system continues to operate. During this remapping process, a state machine in the memory controller cycles through the memory using a counter, wherein all memory locations below the counter have been remapped and all memory locations above the counter have not been remapped. All memory accesses which take place during the remapping process are checked against the counter to determine whether the locations have been remapped. If the counter indicates the codeword has not yet been remapped, the system can still perform a single-error correction on the codeword. Once the entire memory has been remapped, the memory can tolerate another entire chip failure. Note that during the remapping process, codewords for addresses that have not yet been remapped are vulnerable to a subsequent chip failure.

Accessing a Block of Data after Failure of More than a Partial Component

Figure 6:
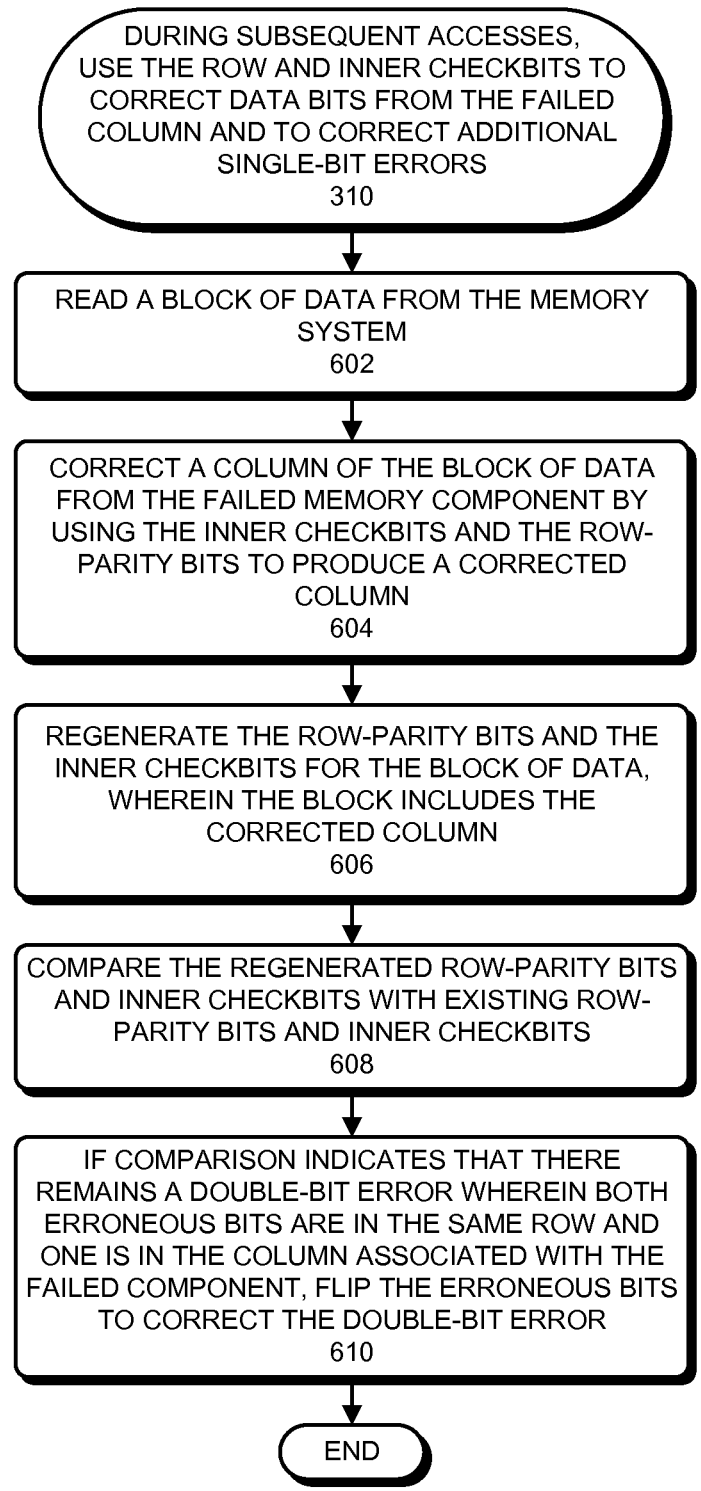
FIG. 6 presents a flow chart illustrating the process of accessing a block of data after a failure of more than a partial memory component in accordance with an embodiment of the present invention.

FIG. 6 presents a flow chart illustrating the process of accessing a block of data after a failure of more than a partial memory component (in step 310 of FIG. 3) in accordance with an embodiment of the present invention. In this case, the correcting and remapping operations do not take place. Instead, while performing each subsequent memory access to a block of data, the memory system corrects a column associated with the failed component in the block of data by using the checkbits and the data bits to produce a corrected column.

More specifically, the memory system first reads the block of data from the memory devices (step 602). Next, the memory system corrects a column associated with the failed component in the block of data to produce a corrected column (step 604). This involves using the row syndrome to identify erroneous bits in the data-bit column associated with the failed memory component, and flipping the identified erroneous bits to produce the corrected data-bit column.

Next, the memory system regenerates the row-parity bits and the inner checkbits for the block of data including the corrected column (step 606).

The memory system then compares the regenerated row-parity bits and inner checkbits with existing row-parity bits and inner checkbits (step 608). If this comparison indicates that there remains a double-bit error, wherein both erroneous bits are in the same row and one is in the column associated with the failed component, the memory system flips the erroneous bits to correct the double-bit error (step 610).

Conclusion

Using the above-described techniques, the system can correct for a subcomponent failure, and then a subsequent subcomponent failure or an entire chip failure. After this second failure, the system can additionally correct a subsequent single-bit error in any component. However, the system cannot correct for an additional component or subcomponent failure until after a servicing operation is performed to replace the failed components/subcomponents. Note that if an entire component fails initially it is not possible to perform the sparing operation. Hence, in this case, the system can only perform single-error correction until the system is serviced.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for facilitating probabilistic error correction with partial-component sparing in a memory system, the method comprising:
   accessing a memory system, wherein each block of data in the memory system includes an array of bits logically organized into R rows and C columns, including a row-checkbit column containing row-parity bits for each of the R rows, an inner-checkbit column containing X=R−S inner checkbits and S spare bits, and C-2 data-bit columns containing data bits, wherein each column in the C columns is stored in a different memory component, and wherein the checkbits, which comprise the row-parity bits and the inner checkbits, are generated from the data bits to provide guaranteed detection and probabilistic correction for a failed memory component; and
   upon determining a failure for a component in the memory system that has failed,
      examining a pattern of errors associated with the component in the memory system that has failed to determine if the failure affects a partial component associated with S or fewer bits of an associated failed column, and
      if so, correcting and remapping data bits from the partial component to the S spare bits in the inner-checkbit column, and after the correcting and remapping are complete, resuming accesses to the memory system with guaranteed detection and probabilistic correction of a subsequent failed memory component.

2. The method of claim 1, wherein determining the failure for the component in the memory system that has failed involves:
   accessing a block of data from the memory system, wherein accessing the block of data comprises accessing existing bits in the row-checkbit column and the inner-checkbit column for the block;
   regenerating checkbits for the row-checkbit column and the inner-checkbit column from data bits in the data-bit columns for the accessed block of data;
   comparing the regenerated checkbits with the existing bits; and
   determining that the memory component has failed based on the comparison.

3. The method of claim 2, wherein comparing the regenerated checkbits with the existing checkbits involves:
   computing a row syndrome by exclusive-ORing regenerated row-parity bits for the regenerated checkbits with existing row-parity bits for the existing bits;
   computing an inner syndrome by exclusive-ORing regenerated inner checkbits for the regenerated checkbits with existing inner checkbits for the existing bits; and
   if the row syndrome viewed as an element of $GF(2^x)$ is non-zero, using the row syndrome and the inner syndrome to determine a key for a column associated with the failed memory component, and then comparing the determined key against a set of keys to identify the failed memory component.

4. The method of claim 3, wherein for a given block of data, correcting the data bits from the partial component involves:
   correcting a partial column associated with the partial component in the given block by using the checkbits and the data bits to produce a corrected partial column; and
   regenerating the row-parity bits and the inner checkbits for the given block, wherein the given block includes the corrected partial column.

5. The method of claim 4, wherein correcting the partial column associated with the partial component involves:
   using the row syndrome to identify erroneous bits in the partial column associated with the failed partial component; and
   flipping the erroneous bits to produce the corrected partial column.

6. The method of claim 1, wherein if the pattern of errors indicates that the failure affects more than a partial component, the remapping does not take place, and instead while performing a subsequent memory access to a block of data, the method comprises:
   correcting a column associated with the failed component in the block of data to produce a corrected column;
   regenerating the row-parity bits and the inner checkbits for the block of data including the corrected column;
   comparing the regenerated row-parity bits and the regenerated inner checkbits with existing row-parity bits and inner checkbits; and
   if the comparison indicates that there remains a double-bit error wherein both erroneous bits are in a same row and one is in the column associated with the failed component, flipping the erroneous bits to correct the double-bit error.

7. The method of claim 6, wherein correcting the column associated with the failed memory component involves:
   using the row syndrome to identify erroneous bits in the column associated with the failed memory component; and
   flipping the identified erroneous bits to produce the corrected column.

8. The method of claim 6, wherein comparing the regenerated row-parity bits and the regenerated inner checkbits with the existing row-parity bits and inner checkbits involves:
   computing a row syndrome by exclusive-ORing the regenerated row-parity bits with the existing row-parity bits;
   computing an inner syndrome by exclusive-ORing the regenerated inner checkbits with the existing inner checkbits; and
   determining from the row syndrome and the inner syndrome whether there remains a double-bit error wherein both erroneous bits are in a same row and one is in the column associated with the component in the memory system that has failed.

9. The method of claim 1,
   wherein the row-checkbit columns contain a row-parity bit for each of the R rows in each of the blocks of data; and
   wherein the inner checkbits are defined to cover bits in the array of bits in accordance with a set of check vectors, wherein each check vector is associated with a different bit in the array and is an element of a Galois field ($GF(2^x)$), wherein check vectors in the set are derived from a set of keys which are unique elements of $GF(2^x)$, wherein each key is associated with a different column of the array, and wherein the check vector for a row r of a column c is the product in $GF(2^x)$ of the key for the column c and $\alpha^r$, wherein $\alpha$ is a primitive element of $GF(2^x)$.

10. The method of claim 9, wherein the set of keys are elements of a subfield of $GF(2^x)$, wherein the subfield does not contain any $\alpha^i$, where $1 \leq i < R$.

11. The method of claim 9, wherein $CV(x, y)$ is the check vector associated with a bit at row x and column y of the array of bits, wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

12. The method of claim 9, wherein a key associated with a column $c_y$ is denoted as key($c_y$), wherein y is a positive integer, and wherein the set of keys are selected so that for any row r, and for any three distinct columns $c_1$, $c_2$ and $c_3$, key($c_1$) XOR key($c_2$) is not equal to the product in $GF(2^x)$ of key($c_1$) XOR key($c_3$) and $\alpha^r$.

13. The method of claim 1, wherein the partial component includes:
   a subset of S contiguous bits of a column associated with the failed component, in which case an identifier for the subset of S contiguous bits is used to indicate which bits have failed; or
   a subset of S non-contiguous bits of the column associated with the failed component, in which case a bit map is used to indicate which bits have failed.

14. A memory system that facilitates probabilistic error correction with partial component sparing, comprising:
   an access mechanism configured to access a block of data from the memory system, wherein each block of data in the memory system includes an array of bits logically organized into R rows and C columns, including a row-checkbit column containing row-parity bits for each of the R rows, an inner-checkbit column containing X=R−S inner checkbits and S spare bits, and C-2 data-bit columns containing data bits, wherein each column in the C columns is stored in a different memory component, and wherein the checkbits which comprise the row-parity bits and the inner checkbits, are generated from the data bits to provide guaranteed detection and probabilistic correction for a failed memory component; and
   an error-handling mechanism, wherein upon determining a failure for a component in the memory system has failed, the error-handling mechanism is configured to,
      examine a pattern of errors associated with the component in the memory system that has failed to determine if the failure affects a partial component associated with S or fewer bits of an associated failed column, and
      if so, correct and remap data bits from the partial component to the S spare bits in the inner-checkbit column, and after the correcting and remapping are complete, resuming accesses to the memory system with guaranteed detection and probabilistic correction of a subsequent failed memory component.

15. The memory system of claim 14, wherein for a given block, the error-handling mechanism is configured to correct the data bits from the partial component by:
   correcting a partial column associated with the partial component in the given block by using the checkbits and the data bits to produce a corrected partial column; and
   regenerating the row-parity bits and the inner checkbits for the given block, wherein the given block includes the corrected partial column.

16. The memory system of claim 14, wherein if the pattern of errors indicates that the failure affects more than a partial component, the remapping does not take place, and instead while performing a subsequent memory access to a block of data, the error-handling mechanism is configured to:
   correct a column associated with the failed component in the block of data by using the checkbits and the data bits to produce a corrected column;
   regenerate the row-parity bits and the inner checkbits for the block of data including the corrected column;
   compare the regenerated row-parity bits and the regenerated inner checkbits with existing row-parity bits and inner checkbits; and
   if the comparison indicates that there remains a double-bit error wherein both erroneous bits are in a same row and one is in the column associated with the failed component, flip the erroneous bits to correct the double-bit error.

17. The memory system of claim 14,
   wherein the row-checkbit columns contain a row-parity bit for each of the R rows in each of the blocks of data; and
   wherein the inner checkbits are defined to cover bits in the array of bits in accordance with a set of check vectors, wherein each check vector is associated with a different bit in the array and is an element of a Galois field ($GF(2^x)$), wherein check vectors in the set are derived from a set of keys which are unique elements of $GF(2^x)$, wherein each key is associated with a different column of the array, and wherein the check vector for a row r of a column c is the product in $GF(2^x)$ of the key for the column c and $\alpha^r$, wherein $\alpha$ is a primitive element of $GF(2^x)$.

18. The memory system of claim 17, wherein the set of keys are elements of a subfield of $GF(2^x)$, wherein the subfield does not contain any $\alpha^i$, where $1 \leq i < R$.

19. The memory system of claim 18, wherein $CV(x, y)$ is the check vector associated with a bit at row x and column y of the array of bits, wherein the set of keys are selected so that for any two distinct rows $r_1$ and $r_2$ and any three distinct columns $c_1$, $c_2$, and $c_3$, $CV(r_1, c_1)$ XOR $CV(r_2, c_2)$ XOR $CV(r_1, c_3)$ XOR $CV(r_2, c_3)$ is not equal to zero.

20. A computer system with a memory that facilitates probabilistic error correction with partial-component sparing, comprising:
   one or more processors; and
   a memory;
   wherein the memory includes an access mechanism configured to access a block of data from the memory system, wherein each block of data in the memory system includes an array of bits logically organized into R rows and C columns, including a row-checkbit column containing row-parity bits for each of the R rows, an inner-checkbit column containing X=R−S inner checkbits and S spare bits, and C-2 data-bit columns containing data bits, wherein each column in the C columns is stored in a different memory component, and wherein the checkbits, which comprise the row-parity bits and the inner checkbits, are generated from the data bits to provide guaranteed detection and probabilistic correction for a failed memory component; and
   wherein the memory includes an error-handling mechanism, wherein upon determining a failure for a component in the memory system that has failed, the error-handling mechanism is configured to,
      examine a pattern of errors associated with the component in the memory system that has failed to determine if the failure affects a partial component associated with S or fewer bits of an associated failed column, and
      if so, correct and remap data bits from the partial component to the S spare bits in the inner-checkbit column, and resume accesses to the memory system with guaranteed detection and probabilistic correction of a subsequent failed memory component.

* * * * *

UNITED STATES PATENT AND TRADEMARK OFFICE
CERTIFICATE OF CORRECTION

PATENT NO. : 8,621,290 B2  
APPLICATION NO. : 12/782580  
DATED : December 31, 2013  
INVENTOR(S) : Daga et al.

Page 1 of 1

It is certified that error appears in the above-identified patent and that said Letters Patent is hereby corrected as shown below:

Title page, item (54) and in the Specification, column 1, line 2, under title, delete "PROBALISTIC" and insert -- PROBABILISTIC --, therefor.

In the Claims

In column 10, line 49, in Claim 14, delete "checkbits" and insert -- checkbits, --, therefor.

Signed and Sealed this  
Fifteenth Day of July, 2014

Michelle K. Lee  
*Deputy Director of the United States Patent and Trademark Office*